(12) United States Patent
Walsh

(10) Patent No.: US 8,278,958 B2
(45) Date of Patent: Oct. 2, 2012

(54) SEMICONDUCTOR TEST SYSTEM AND METHOD

(75) Inventor: James Paul Walsh, Cambridge (GB)

(73) Assignee: Cambridge Silicon Radio Ltd., Cambridgeshire (GB)

( * ) Notice: Subject to any disclaimer, the term of this patent is extended or adjusted under 35 U.S.C. 154(b) by 265 days.

(21) Appl. No.: 12/434,010

(22) Filed: May 1, 2009

(65) Prior Publication Data

US 2010/0277196 A1 Nov. 4, 2010

(51) Int. Cl.
*G01R 31/20* (2006.01)
(52) U.S. Cl. .......... 324/757.03; 324/757.04; 324/754.03
(58) Field of Classification Search ............ 324/757.02–757.05, 754.03, 754.1–754.14, 755.01–755.11, 324/762.01, 762.05
See application file for complete search history.

(56) References Cited

U.S. PATENT DOCUMENTS

| | | | | |
|---|---|---|---|---|
| 5,514,884 A | * | 5/1996 | Hively et al. | 257/203 |
| 5,623,214 A | * | 4/1997 | Pasiecznik, Jr. | 324/755.09 |
| 5,736,850 A | * | 4/1998 | Legal | 324/754.07 |
| 5,818,249 A | * | 10/1998 | Momohara | 324/756.03 |
| 6,411,079 B1 | * | 6/2002 | Nishikawa | 324/750.19 |
| 6,603,324 B2 | * | 8/2003 | Eldridge et al. | 324/756.02 |
| 6,897,670 B2 | * | 5/2005 | Burns | 324/750.02 |
| 7,055,123 B1 | * | 5/2006 | Norman | 716/130 |
| 7,358,750 B2 | * | 4/2008 | Mizoguchi et al. | 324/750.22 |
| 7,453,261 B1 | * | 11/2008 | Mark | 324/754.03 |
| 7,768,278 B2 | * | 8/2010 | Mayder | 324/754.03 |
| 2003/0234659 A1 | * | 12/2003 | Zieleman | 324/765 |

* cited by examiner

*Primary Examiner* — Joshua Benitez

(74) *Attorney, Agent, or Firm* — Frommer Lawrence & Haug LLP; John W. Branch

(57) ABSTRACT

A method of testing semiconductor devices, the method includes the steps of making a first set of electrical connections to a first set of devices to allow a first set of tests to be performed on that set of devices and concurrently making a second set of electrical connections to a second set of devices to allow a second set of tests to be performed on the second set of devices, wherein the first and second sets of tests are different, and concurrently performing the first set of tests on the first set of devices and the second set of tests on the second set of devices.

19 Claims, 6 Drawing Sheets

SEMICONDUCTOR TEST SYSTEM AND METHOD

BACKGROUND

This invention relates to the testing of semiconductor devices, and particularly to the parallel testing of multiple semiconductor devices, for example, on a wafer. Semiconductor devices are manufactured in the form of wafers comprising multiple devices. A typical wafer may contain many thousands of devices. The wafers are diced into individual dies for final packaging.

Testing of devices is often performed prior to dicing of the wafer as it is convenient to handle a single wafer rather than individual dies to perform the testing. Devices may also be tested after packaging.

Testing is performed using Automated Test Equipment (ATE) which, together with a Device Handler or Wafer Prober, makes contact with each device to be tested and performs the required tests. Contact with the device may be achieved by probes or pins on a test head or a socket contacting pads or balls on devices. Practical considerations restrict testing to one or a very small subset of the devices on a wafer simultaneously. Current ATE has sufficient resources (power supplies, signal sources, data acquisition channels) to test 8 or 16 devices at a time. The ATE makes contacts with devices in turn, typically moving the wafer, to sequentially test each device (or the subset selected for test) in turn.

ATE generally provides a standard set of sources and measurement systems which are interfaced to a particular device under test using a probe card. Such a system allows the use of standard ATE for testing multiple device designs without requiring redesign of the whole system. Probe cards are interfaces boards that connect between the standard ATE connections and the particular inputs and outputs of the devices under test.

The resources of the ATE can be configured for use in the manner that best suits the particular devices under test. This is achieved by specific design of the probe card and software to control the operation of the ATE. The resources may be utilized to test each device, or a subset thereof, contacted by the probe card (typically 8 or 16) simultaneously. Testing time is therefore reduced for a given number of devices on a wafer. The number of devices that can be tested in parallel is limited by the resources of the ATE. Increasing the resources available in ATE is generally extremely expensive and may not provide a cost-efficient route to improving test times.

Testing time can be reduced by performing two or more tests concurrently on each device. For example, it may be possible to perform RF testing at the same time as digital testing. However, the number of tests that can be performed in parallel is limited by conflicting resources in the devices thereby limiting the reduction in test time.

There is therefore a requirement for a test system to reduce test times without requiring additional resources from the ATE.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

There is provided a method of testing semiconductor devices, the method comprising the steps of making a first set of electrical connections to a first set of devices to allow a first set of tests to be performed on that set of devices and concurrently making a second set of electrical connections to a second set of devices to allow a second set of tests to be performed on the second set of devices, wherein the first and second sets of tests are different, and concurrently performing the first set of tests on the first set of devices and the second set of tests on the second set of devices.

There is also provided a contact device for making contact between test equipment and semiconductor devices, comprising a first set of test positions for making a first set of electrical contacts with each of a first set of the devices, the first set of electrical contacts allowing a first set of tests to be performed on the first set of devices, and a second set of test positions for concurrently making a second set of electrical contacts with each of a second set of the devices, the second set of electrical contacts allowing a second set of tests to be performed on the second set of devices, wherein the first and second sets of tests are different and the first and second sets of devices do not overlap.

The steps of the method may be repeated a plurality of times, wherein the devices forming the first and second sets of devices are different for each repetition. The first and second sets of tests may be discrete.

The method may further comprise the step of storing data relating to the results of the tests.

The method may further comprise the step of correlating data from the first and second sets of tests on each device.

The devices may be on a wafer and the wafer may be a bare wafer.

The devices may be WLCSP devices or packaged devices.

The contact device may be a probe card for contacting devices on a wafer.

The devices may be WLCSP devices.

The wafer may be a bare wafer.

The contact device may be a Device Interface Board for contacting packaged devices.

There is also provided automated test equipment comprising the contact device.

The automated test equipment may further comprise means to move the wafer relative to the probe card to vary the devices of the wafer that comprise the first and second sets of devices.

The automated test equipment may further comprise processing apparatus to correlate the results of the first and second sets of tests for each device.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
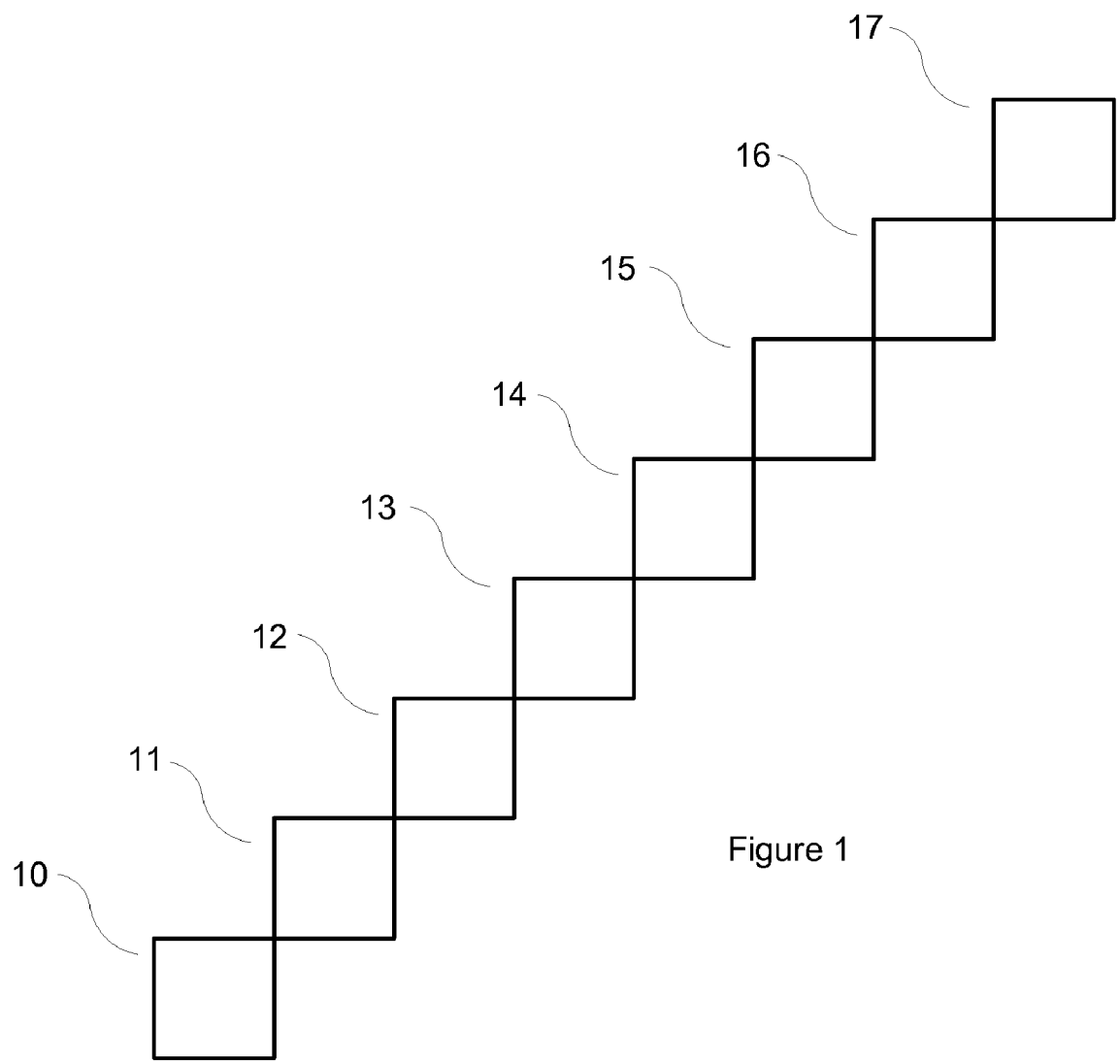
FIG. 1 shows a schematic diagram of contact positions of a conventional probe card.

FIG. 1 shows a schematic diagram of the locations of devices contacted by a typical probe card for testing 8 devices concurrently. Each square 10-17 represents a device to which contact will be made for testing. The probe card or wafer is moved such that each device of the wafer is contacted in turn. The probe card connects each of 8 devices to the resources of the ATE such that each device is supplied with power and signals, and the outputs of the devices are connected to the appropriate measurement instruments of the ATE. The ATE is programmed to provide predetermined power and stimulus to each device and to make measurements on each device to ascertain its performance. Each device typically requires a large number of connections and the design of the probe card is a challenging task to ensure all signals are routed correctly to and from their destination. The geometric layout shown is a common layout used to facilitate the routing of signals, but the current invention is not related to any particular geometric layout of the contacted devices.

Figure 2:
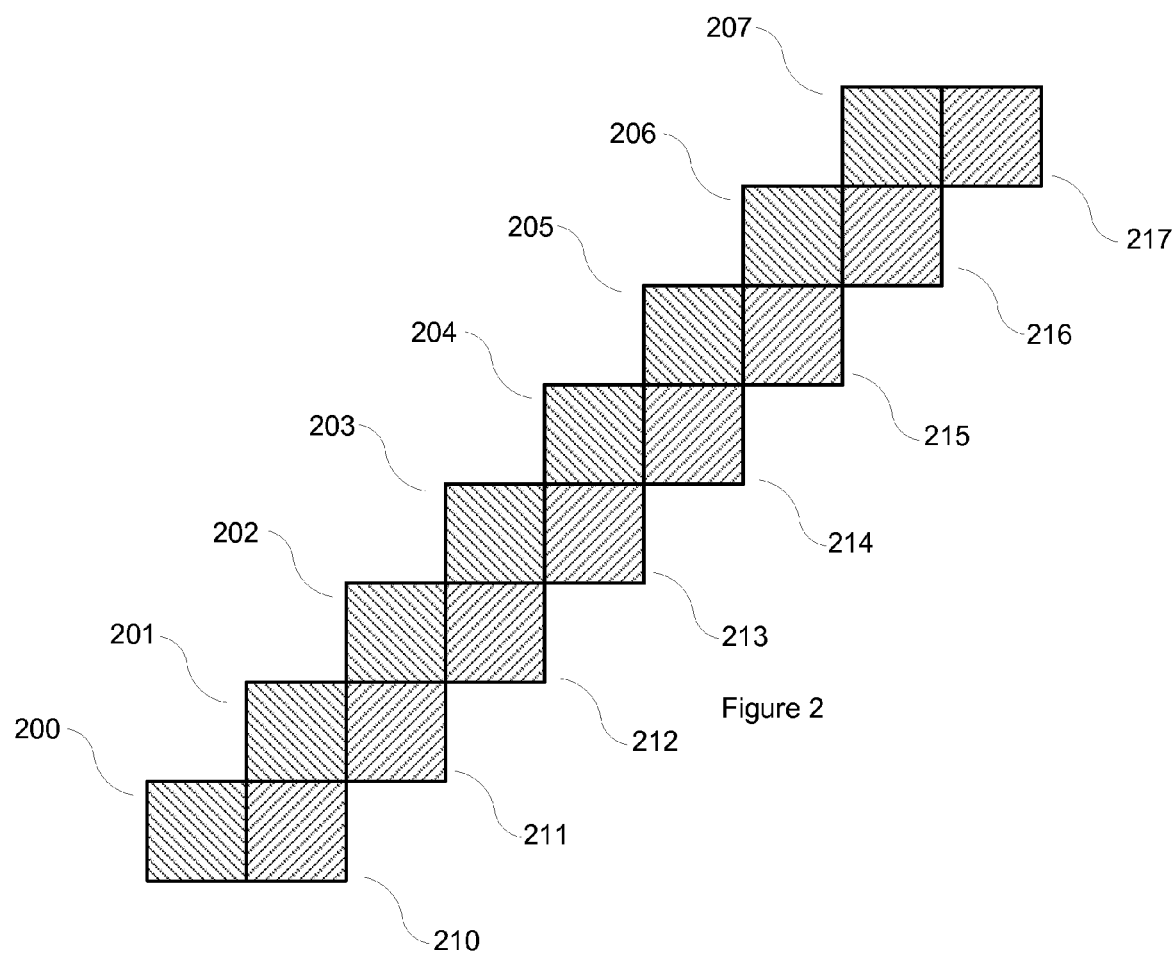
FIG. 2 shows a schematic diagram of contact positions of a probe card according to an example of the invention.

FIG. 2 shows a schematic diagram of the locations of devices contacted by a probe card according to an embodiment of the current invention. The probe card is designed to make contact with 16 devices, split into two banks of devices (Bank 1 comprising devices 200-207, and Bank 2 comprising devices 210-217). Connections are only made to a subset of the connections of each device such that only a subset of the total tests can be performed on that device. For example, the devices 200-207 of Bank 1 may be connected such that Built In Self Test (BIST) and RF testing can be performed, while the devices 210-217 of Bank 2 may be connected such that Continuity, Digital and Analogue testing can be performed. The precise connections made will depend on the requirements of the device and the particular tests to be performed by each bank. Some connections, for example DC power, will be made to both banks as they are required for the tests performed in both banks.

The number of devices connected to the ATE has been doubled compared to the 8-device probe card of FIG. 1, but the ATE resources required to perform tests have not also been doubled because only a discrete subset of connections are made to each device. As noted, some connections are required to both banks and so the resources required do increase, but not by a factor of 2.

The probe card design of FIG. 2 allows an improvement in the testing speed by allowing increased concurrent testing to be performed by the use of the methods explained below. As explained previously the tests that can be performed concurrently on a single device are limited by the resources and operation of each device. However, with the probe card of FIG. 2 different tests are performed on different devices, thus allowing tests which would clash on a single device, to be performed concurrently. A reduction in test time is therefore attained compared to prior art systems.

Figure 3:
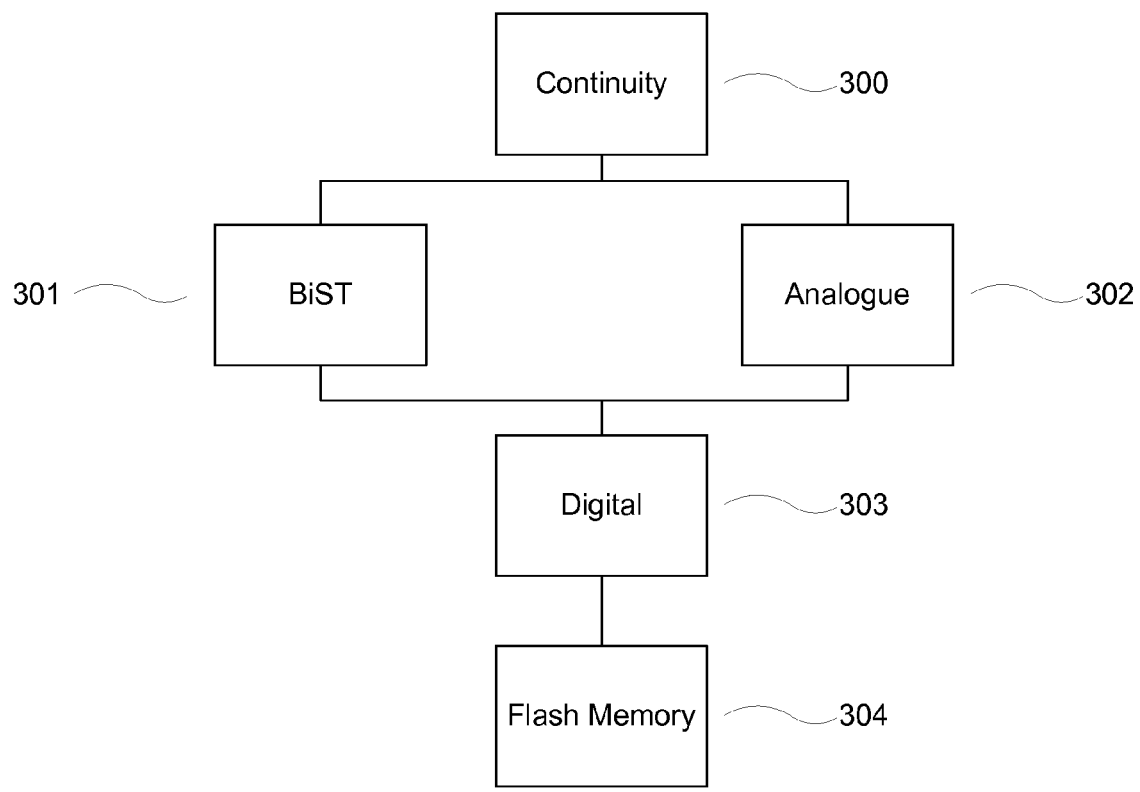
FIG. 3 shows a conventional test method.

FIG. 3 shows a flow chart of a testing methodology for a prior art system in which four tests are performed on each device.

At block 300 a continuity test is performed. At blocks 301 and 302 an RF BiST and an analogue test are performed in parallel as their resources do not clash and therefore they can be run concurrently. At blocks 303 and 304 Digital and Flash Memory tests are performed sequentially as resource conflicts prevent them being run at the same time. Assuming that each test takes one unit of time (in reality different tests take different times, but this simple example serves to demonstrate the time reductions provided) the tests of FIG. 3 take 4 units of time.

Figure 4:
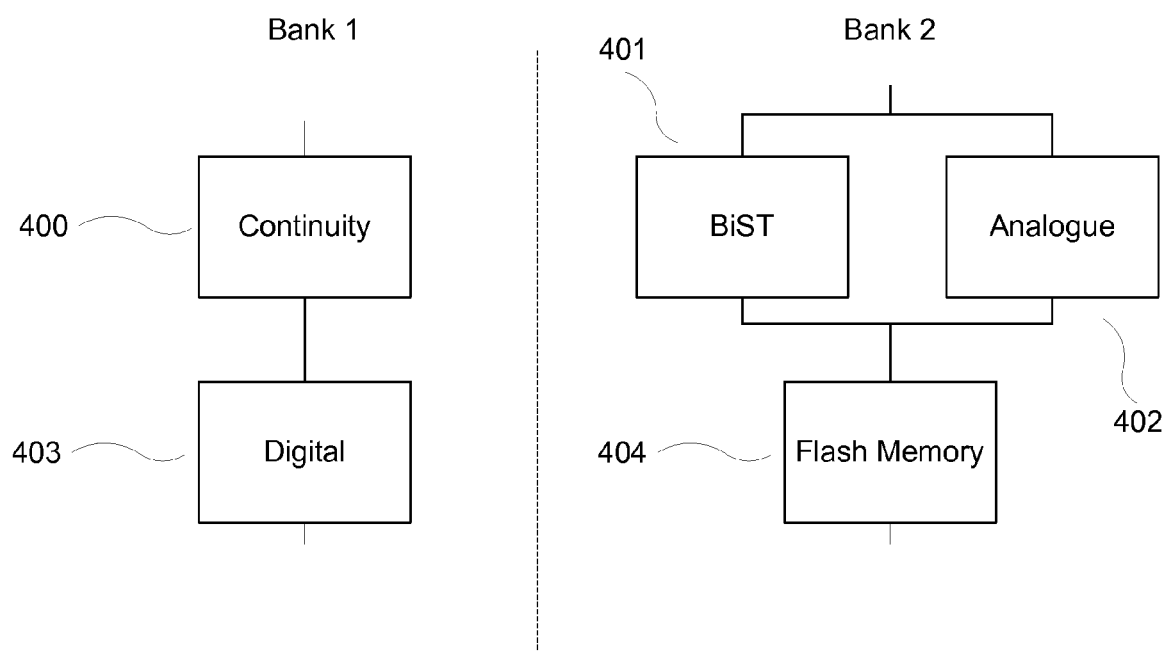
FIG. 4 shows a flow chart of a test method using two banks of contact positions.

FIG. 4 shows a flow chart of the same tests performed in FIG. 3, but implemented using the probe card of FIG. 2. At block 400 the continuity test is performed on the devices in the first bank, at the same time as the BiST and Analogue tests are performed at blocks 401 and 402 on the second bank of devices. The digital and Flash memory tests are then performed at blocks 403 and 404 on the first and second banks of devices respectively.

At this point, the devices of each bank have been a partially tested and to complete the testing of each device it must be connected to the other bank. In the logically simplest implementation, the banks are reversed and the second half of the tests performed. After the second stage each of the 16 devices has been fully tested, but the total test time is only 8 units (making the same assumptions as above) plus the time to reposition the probe card between the two stages, which time is minimal compared to the testing time. The number of devices tested has thus doubled, but the time has not, thereby increasing the testing efficiency.

In practice the logically simple method of swapping the device connected to the first and second banks is not practical as rotation of the card or wafer is required, which leads to connections not matching. A probing pattern or map must thus be designed that allows each device to be contacted by a site in both banks of the probe card. The requirement for each device to be contacted by both banks can lead to an increase in the number of probe card/wafer positions in which not all test sites are utilized, but that increase only offsets a small portion of the time reduction due to the general method.

Figure 5:
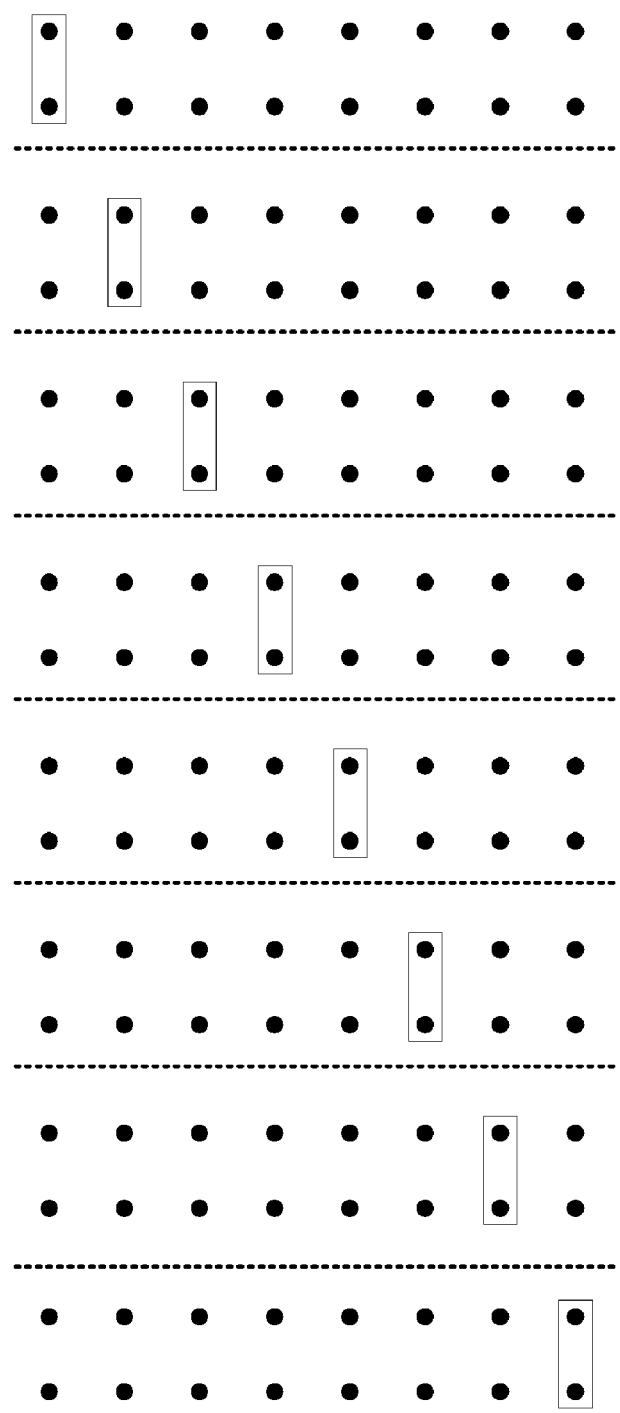
FIG. 5 shows a schematic diagram of contact positions of a conventional probe card.
Figure 6:
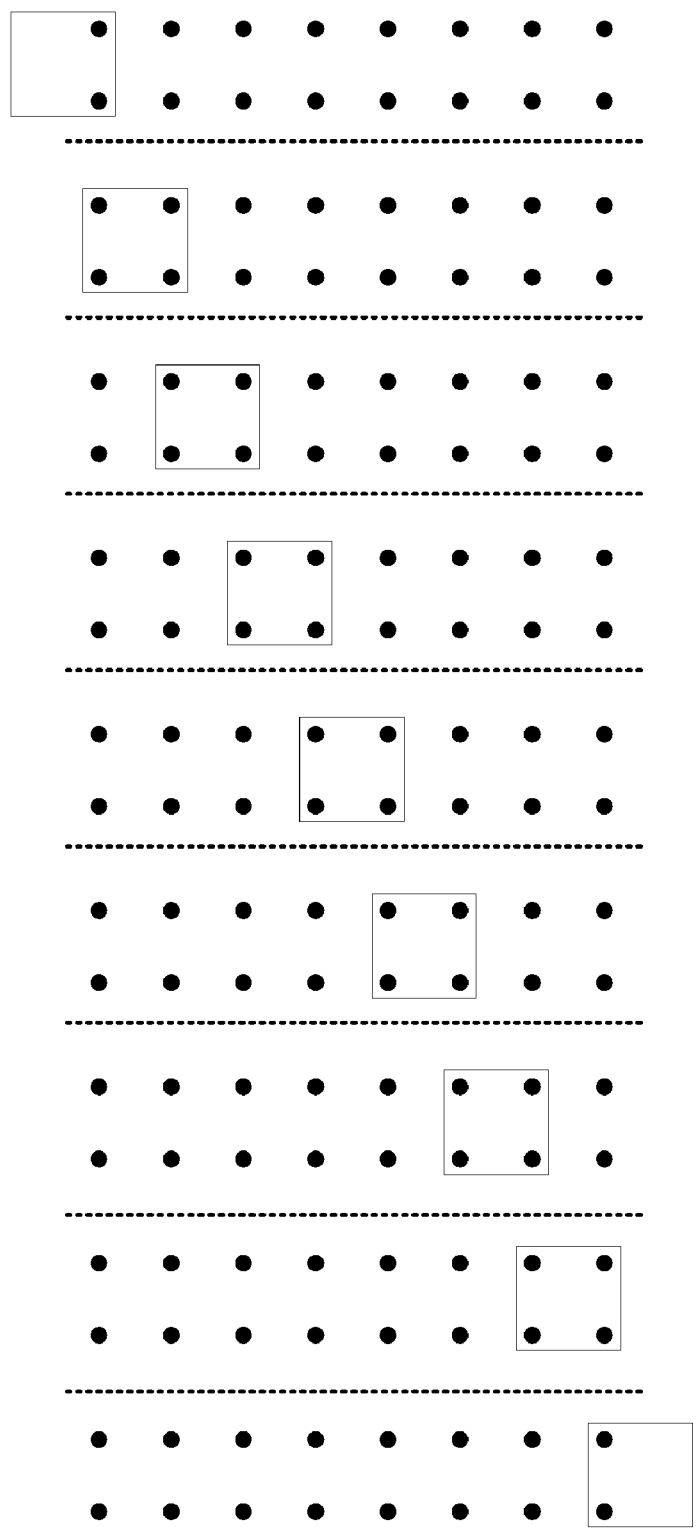
FIG. 6 shows a schematic diagram of contact positions of a probe card having two banks of contacts positions.

This is demonstrated in FIGS. 5 and 6 which show schematic diagrams of devices arranged in a simple fashion. The layout of devices on a wafer is more complex, but this simple structure illustrates the principle. Each spot marks the centre of a device and the solid outline indicates the devices contacted by the probe card in each position.

FIG. 5 shows the series of positions for a conventional probe card which contacts two devices and tests those devices concurrently according to the flow-chart of FIG. 3. 8 positions are required to test all 16 devices, each position taking 4 units of time. The total test time is therefore 32 units, plus the time taken for 7 moves of the probe card between the sites.

FIG. 6 shows the series of positions for a probe card configured according to FIG. 2. In order to probe every device with the first and second banks, the first and last positions only contact two devices. A total of 9 positions are used, each requiring 2 units of time to perform the tests in that position. The total test time is therefore 18 units, plus the time taken for 8 moves of the probe card. Probe card move times are insignificant in comparison to test times, and therefore the reduction by 14 units of test time is much larger than the increase caused by one extra probe card move. For example, the total test time for a 2000 device wafer using a conventional system may be of the order of 40 minutes, comprising only 3 minutes of movement time.

The examples of FIGS. 5 and 6 are for simple device and probe card layouts, and for practical layouts the conventional probe card will also utilize positions in which only some of the device contact locations are utilized.

The probe card layout and testing methods described hereinbefore may therefore lead to a significant reduction in test time by allowing an increase in the tests that can be performed concurrently. The actual reduction in test time will depend strongly on which tests can be performed concurrently and the number of partial contacts that are required to ensure every site is probed by both banks.

The example given above assumed that all of the tests took the same amount of time and could be performed totally concurrently, this may not be the case in practice and so test time reductions may not be as significant as shown in the example. Optimization of the testing structure is performed in the same manner as with conventional probe cards designs by calculating the most efficient way of packing the tests together.

The example provided above utilized two banks of devices, but the principles are also applicable to more than two banks. For example, three banks could be utilized, each bank being connected to perform different tests on the contacted devices. Similarly, 8 positions per bank is given by way of example only and any number of positions may be utilized depending on the resources available in the ATE and the tests required on each device.

The geometrical layout of the device contacts of the probe card may be defined according to the particular wafer layout being tested, the layout of the devices, or for efficient routing of signals on the card. The contacts shown in the figures are for example only and in no way restrict the layouts contemplated by the current invention which is applicable to any and all layouts. Optimization of the device contact pattern is performed according to the same principles used for conventional probe cards.

Probe cards according to the invention may pose simpler routing and design problems as the number of connections to each device position is reduced, thereby reducing density of connections in the probe card.

During testing a wafer map is typically generated which relates the testing results to devices over the area of the wafer. Since the tests on each device are not complete until the device has been visited by both banks, the system for gathering, compiling and analyzing the test data may require modification such that it can correctly capture and correlate the data from the two banks.

Where language relating to the probe card "contacting" devices has been used, it is used in the context of a set of electrical connections being made to a device by any appropriate means. This may be by the contacting of pads on the probe card with solder bumps or balls on WLCSP devices, or by the contacting of probes with contact pads on the wafer surface on unpackaged devices.

The examples of tests to be performed are given for example only and the principles of the invention apply regardless of the actual tests involved. Similarly the distribution of resources between the first and second banks is given for example only and the principles of the invention apply regardless of the distribution utilized. The distribution of resources is selected depending on the capabilities of the ATE, and the best fit of the various tests to be performed such that all tests can be performed in the minimum possible time.

As in conventional testing, the test process for a given device may be stopped once that device fails a test. If a device fails a test in the first bank applied to it, the device may be omitted from the tests performed by the second bank.

The description of the banks as 'first' and 'second' is not intended to require that the banks are applied to each device in that order. Depending on the wafer layout and movement of the probe card locations it may be more efficient for some devices to be tested by the second bank first and subsequently by the first bank. Similarly, a given device does not need to be tested by the first and second banks immediately sequentially. After testing by a first of the banks, a number of other devices may be tested before the probe card returns to apply the second of the banks to the device.

The above description is given principally in the context of testing WLCSP devices before dicing, but the principles described are equally applicable to the testing of packaged devices by simply modifying the equipment to contact packaged devices rather than devices on a wafer. For example, a Device Handler and Device Interface Board may be utilized to handle and contact the devices. Similarly, the techniques are equally applicable to WLCSP devices on a wafer and devices on a bare wafer with suitable modification of the wafer prober contacts.

Where the words concurrently and simultaneously, and cognate words, have been used they are used to describe some degree of overlap between the process or steps, and are not intended to suggest that the processes are performed for exactly the same periods of time, nor that they start or stop at the same times. Similarly, not all parts of each of the concurrent process may be performed truly concurrently, but each of the concurrent processes may comprise sub-processes performed at different times during the overall process. Not all parts of a first process must be performed at the same time as all parts of a second process.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A method of testing a plurality of semiconductor devices on a wafer using a single piece of automated testing equipment, each device having the same plurality of electrical connections, each semiconductor device comprising a first subset and a second subset of electrical connections, wherein the first subset and the second subset of electrical connections are different, and wherein the first subset of each device and the second subset of each device are the same for each device, the method comprising the steps of:

(a) using a probe card to make a first set of electrical connections from the automated test equipment to the first subset of the electrical connections of a first set of the plurality of devices to allow a first set of tests to be performed on the first set of devices and concurrently making a second set of electrical connections from the automated test equipment to the second subset of the electrical connections of a second set of the plurality of devices to allow a second set of tests to be performed on the second set of devices, wherein the first and second sets of tests are different;

(b) concurrently performing the first set of tests on the first set of devices and the second set of tests on the second set of devices using the automated test equipment;

(c) relocating the probe card to make the first set of electrical connections from the automated test equipment to the first subset of electrical connections of a first further set of the plurality of devices to allow a first set of tests to be performed on the first further set of devices and concurrently making the second set of electrical connections from the automated test equipment to the second subset of the electrical connections of a second further set of devices to allow the second set of tests to be performed on the second further set of devices; and (d) concurrently performing the first set of tests on the first further set of devices and the second set of tests on the second further set of devices using the automated test equipment.

2. The method according to claim 1, wherein the steps are repeated a plurality of times and wherein the devices forming the first and second sets of devices are different for each repetition.

3. The method according to claim 1, wherein the first and second sets of tests are discrete.

4. The method according to claim 1, wherein the steps further comprise the step of storing data relating to the results of the tests.

5. The method according to claim 4, wherein the steps further comprise the step of correlating data from the first and second sets of tests on each device.

6. The method according to claim 1, wherein the wafer is a bare wafer.

7. The method according to claim 1, wherein the devices are WLCSP devices.

8. A method according to claim 1, further comprising the step of using the probe card to make a third set of electrical connections from the automated test equipment to the second subset of electrical connections of the first set of the plurality of devices to allow the second set of tests to be performed on that set of devices.

9. A probe card for making contact between an item of test equipment and semiconductor devices on a wafer, each device having a plurality of electrical connections, the plurality of electrical connections of each semiconductor device comprising a first subset and a second subset of electrical connections, wherein the first subset and the second subset of electrical connections on each device are different, and wherein the first subset of each device and the second subset of each device are the same for each device, comprising:

a first set of test positions for making a first set of electrical contacts between the test equipment and the first subset of electrical connections of each of a first set of the plurality of devices, the first subset of electrical contacts allowing a first set of tests to be performed on the first set of devices; and a second set of test positions for concurrently making a second set of electrical contacts between the test equipment and the second subset of electrical connections of each of a second set of the plurality of devices, the second subset of electrical connections allowing a second set of tests to be performed on the second set of devices concurrently with the first set of tests;

wherein the first and second sets of tests are different and the first and second sets of devices do not overlap, and wherein the test equipment is movable between the first set of test positions and the second of test positions to allow the first set of tests to be performed on the second set of devices, and to allow the second set of tests to be performed on the first set of devices concurrently.

10. The contact device according to claim 9, wherein the first and second sets of tests are discrete.

11. The contact device according to claim 9, wherein the devices are WLCSP devices.

12. The contact device according to claim 9, wherein the wafer is a bare wafer.

13. A system of testing a plurality of semiconductor devices on a wafer, each device having a plurality of electrical connections, the plurality of electrical connections of each semiconductor device comprising a first subset and a second subset of electrical connections, wherein the first subset and the second subset of electrical connections on each device are different, and wherein the first subset of each device and the second subset of each device are the same for each device, comprising:

an automated piece of test equipment; and a probe card associated with the automated piece of test equipment, the probe card comprising:

a first set of test positions for making a first set of electrical contacts between the automated piece of test equipment and the first subset of electrical connections of each of a first set of the plurality of devices, the first subset of electrical contacts allowing a first set of tests to be performed on the first set of devices; and a second set of test positions for concurrently making a second set of electrical contacts between the automated piece of test equipment and the second subset of electrical connections of each of a second set of the plurality of devices, the second subset of electrical connections being different than the first set of electrical connections and allowing a second set of tests to be performed on the second set of devices concurrently with the first set of tests;

wherein the first and second sets of tests are different and the first and second sets of devices do not overlap, and wherein the test equipment is movable between the first set of test position and the second of test positions to allow the first set of tests to be performed on the second set of devices, and to allow the second set of tests to be performed on the first set of devices concurrently.

14. The system according to claim 13, wherein the first and second sets of tests are discrete.

15. The system according to claim 13, wherein the devices are WLCSP devices.

16. The system according to claim 13, wherein the wafer is a bare wafer.

17. The system according to claim 13, further comprising means to move the wafer relative to the probe card to vary the devices of the wafer that comprise the first and second sets of devices.

18. The system according to claim 13, further comprising a processing apparatus to correlate the results of the first and second sets of tests for each device.

19. A method of testing a plurality of semiconductor devices on a wafer using a single piece of automated testing equipment, each device having the same plurality of electrical connections, each semiconductor device comprising a first subset of electrical connection comprising m connections and a second subset of electrical connections comprising n connections, wherein the first subset of m connections and the second subset of n connections are different, wherein m and n are a combination of connections having any number of connections, and wherein the first subset of m connections of each device and the second subset of n connections of each device are the same for each device, the method comprising the steps of:

(a) using a probe card to make a first set of electrical connections from the automated test equipment to the first subset of the electrical connections of a first set of the plurality of devices to allow a first set of tests to be performed on the first set of devices and concurrently making a second set of electrical connections from the automated test equipment to the second subset of the electrical connections of a second set of the plurality of devices to allow a second set of tests to be performed on the second set of devices, wherein the first and second sets of tests are different;

(b) concurrently performing the first set of tests on the first set of devices and the second set of tests on the second set of devices using the automated test equipment;

(c) relocating the probe card to make the first set of electrical connections from the automated test equipment to the first subset of electrical connections of a first further set of the plurality of devices to allow a first set of tests to be performed on the first further set of devices and concurrently making the second set of electrical connections from the automated test equipment to the second subset of the electrical connections of a second further set of devices to allow the second set of tests to be performed on the second further set of devices; and (d) concurrently performing the first set of tests on the first further set of devices and the second set of tests on the second further set of devices using the automated test equipment.

\* \* \* \* \*